US009834433B2

(12) United States Patent
Chang et al.

(10) Patent No.: US 9,834,433 B2
(45) Date of Patent: Dec. 5, 2017

(54) PIEZOELECTRIC OPTICAL MEMS DEVICE WITH EMBEDDED MOISTURE LAYERS

(71) Applicant: Texas Instruments Incorporated, Dallas, TX (US)

(72) Inventors: YungShan Chang, Plano, TX (US); Ricky A. Jackson, Richardson, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 84 days.

(21) Appl. No.: 14/553,812

(22) Filed: Nov. 25, 2014

(65) Prior Publication Data

US 2015/0378064 A1 Dec. 31, 2015

Related U.S. Application Data

(60) Provisional application No. 62/018,814, filed on Jun. 30, 2014.

(51) Int. Cl.
*B81B 7/00* (2006.01)
*G02B 26/08* (2006.01)
*G02B 1/14* (2015.01)

(52) U.S. Cl.
CPC .............. *B81B 7/0029* (2013.01); *G02B 1/14* (2015.01); *G02B 26/0875* (2013.01)

(58) Field of Classification Search
CPC ... B81B 7/0026; B81B 3/0083; B81B 3/0086; B81B 2201/04; B81B 2203/04; B81B 3/0002; B81B 3/0005; B81B 3/0016; B81B 7/0029; B81B 1/105; B81B 1/18; G02B 1/14; G02B 26/0875; G02B 26/0841; G02B 26/105; G02B 26/085; G02B 26/0858; G02B 26/0833; G02B 26/101; B81C 1/00698; B81C 1/0038

USPC ......... 359/221.2, 169.1, 198.1, 196.1–199.4, 359/200.6–200.8, 202.1, 223.1–225.1, 359/226.2, 290–295, 838, 846, 871, 904; 428/410, 210; 250/204, 559.06, 559.29, 250/230, 234; 347/255–260; 353/39, 353/98–99; 385/15–18, 22; 398/12, 19, 398/45

See application file for complete search history.

(56) References Cited

U.S. PATENT DOCUMENTS

| | | | | |
|---|---|---|---|---|
| 2001/0005536 A1* | 6/2001 | Usami | ................ | G11B 7/00375 428/64.1 |
| 2010/0078075 A1* | 4/2010 | Tsukahara | ............ | B82Y 10/00 136/263 |
| 2015/0376000 A1* | 12/2015 | Chang | ..................... | H02N 2/22 427/100 |

* cited by examiner

*Primary Examiner* — Darryl J Collins
*Assistant Examiner* — Kristina Deherrera
(74) *Attorney, Agent, or Firm* — Jacqueline J. Garner; Charles A. Brill; Frank D. Cimino

(57) ABSTRACT

A piezoelectric optical micro-electro-mechanical systems (POMEMS) device includes a glass layer having a bottom surface and a top surface. The device may also include an upper moisture barrier layer having a top surface and a bottom surface in which the bottom surface of the top moisture barrier layer is substantially coextensive with and interfaces with the top surface of the glass layer. A piezo stack may be attached above the upper moisture barrier layer. The device may also include a lower moisture barrier layer having a bottom surface and a top surface. The top surface of the lower moisture barrier layer is substantially coextensive with and interfaces with the bottom surface of the glass layer. A semiconductor substrate may be attached below the bottom moisture barrier layer.

10 Claims, 4 Drawing Sheets

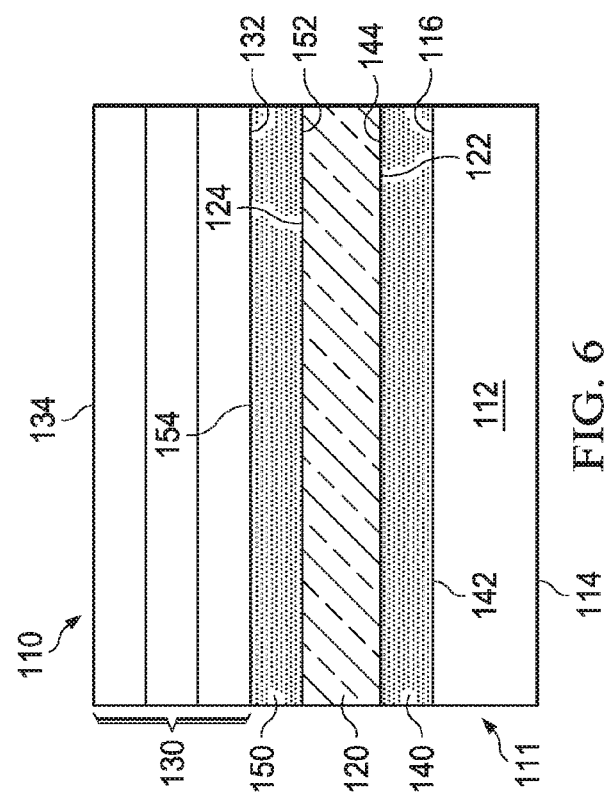
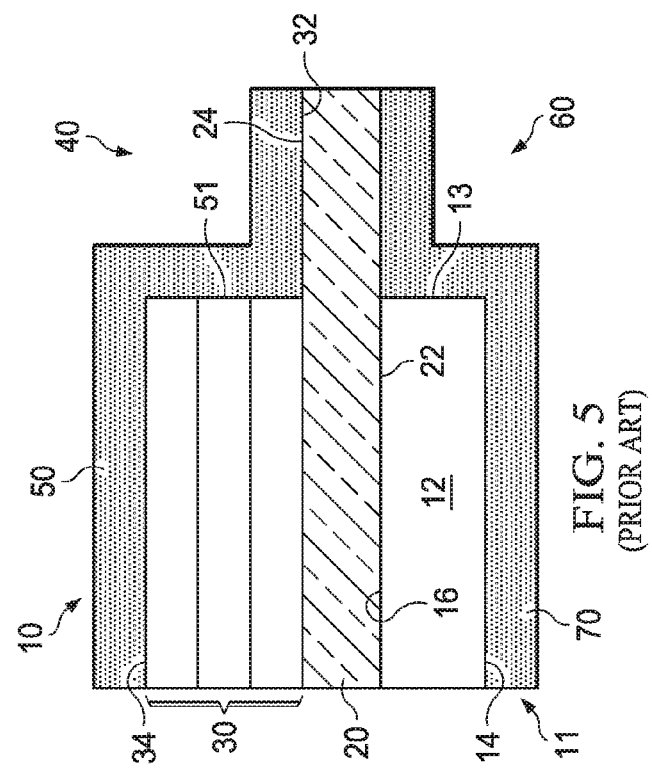
FIG. 6
FIG. 5
(PRIOR ART)

_US 9,834,433 B2_

PIEZOELECTRIC OPTICAL MEMS DEVICE WITH EMBEDDED MOISTURE LAYERS

This application claims priority of U.S. Provisional Application Ser. No. 62/018,814 filed Jun. 30, 2014, which is hereby incorporated by reference of all that is disclosed therein.

BACKGROUND

Piezoelectric optical MEMS devices are used for sensing or manipulating optical signals on a very small size scale using integrated mechanical, optical, and piezoelectric and electrical systems. Examples of such devices include vibration monitors, precision positioners, optical switch, optical cross-connect, tunable VCSEL, and autofocus actuated lenses. These devices are typically fabricated using piezoelectric and conductive electrode materials along with optical and thin-film materials such as silicate glass, silicon, silicon dioxide and silicon nitride.

In piezoelectric optical MEMS devices, silicate glass, such as borophosphosilicate glass (BPSG) or phosphosilicate glass (PSG) is widely used as the lens material. Problems are sometimes encountered with silicate glass because of its high moisture absorbency. When moisture is absorbed by silicate glass used in a lens, the moisture can cause stress in the lens and cause optical properties of the lens, such as offset and transmittance, to drift over time. This, in turn, can result in yield and reliability problems. A conventional countermeasure to such problems is the coating of a moisture barrier on the top and bottom\back of the lens toward the end of the fabrication process.

A problem with this conventional countermeasure is that the subject lens is exposed to the fabrication environment and is also exposed to subsequent manufacture processing environments until the lens is sealed with the moisture barriers. The time period between the time that the lens is exposed to the fabrication and manufacturing environments and the time that the lens is sealed can be days or even weeks. During this period the lens is unprotected from moisture.

Lens fabrication includes formation of a disc shaped wafer, which contains multiple identical lens substrates arranged in adjacent relationship in a grid. This lens substrate grid of the wafer is, after performance of a number of processes on it, cut ("diced"/"singulated") into individual lens components, typically with a wafer saw or stealth laser. One of the lens fabrication processes performed before singulation is forming multiple small, backside holes in the wafer to allow lens movement. (This formation of backside holes is generally referred to in the art as "backside cavity formation".) After backside cavity formation the backside of the wafer must be coated with moisture barrier. This requires handling of the wafer. However, because of the multiple holes produced during backside cavity formation, the wafer has become fragile and more difficult to handle. The handling of a fragile wafer makes moisture barrier coating a difficult task.

BRIEF DESCRIPTION OF THE DRAWINGS

FIGS. 2 through 5 illustrate the performance of successive prior art process steps on the lens assembly of FIG. 1.

FIG. 6 is a schematic illustration of an example embodiment of a new lens assembly for a piezoelectric optical MEMS ("POMEMS") device formed on a semiconductor wafer.

DETAILED DESCRIPTION

Directional terms, such as up, down, bottom, top, vertical, horizontal, etc., are used in a relative sense in this disclosure and are based upon the orientation of the lens assembly 10 shown in FIGS. 1 through 9. Directional terms are not used in an absolute sense to indicate the orientation of the lens assembly 10 in a gravitational field.

Figure 1:
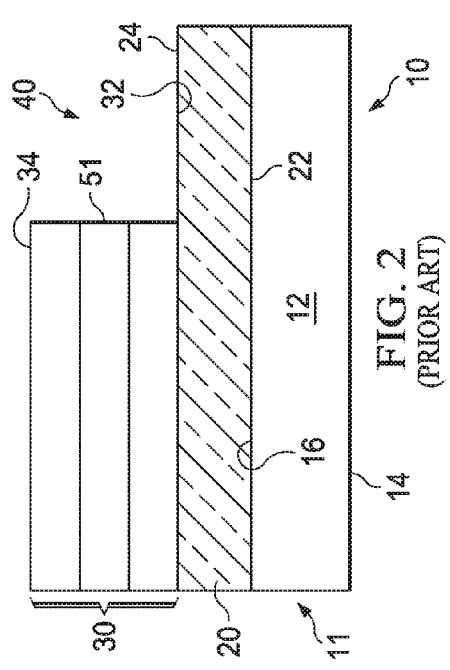
FIG. 1 is a schematic illustration of a prior art lens assembly for a piezoelectric optical MEMS ("POMEMS") device formed on a semiconductor wafer.

FIGS. 1-5 illustrate various stages in the formation of a conventional lens assembly for a POMEMS device. FIG. 1 is a schematic cross-sectional view of a lens assembly 10 for a POMEMS device. This lens assembly 10 represents one of a plurality of such lens assemblies that are provided on a semiconductor wafer 11. The lens assembly 10 includes a semiconductor substrate 12. The semiconductor wafer 11 has a front side surface, which corresponds to a bottom surface 14 of the semiconductor substrate 12. The semiconductor wafer 11 has a backside surface, which corresponds to a top surface 16 of the semiconductor substrate 12. A glass layer 20 having a bottom surface 22 and a top surface 24 is formed on top the semiconductor substrate 12.

A piezo stack 30 having a bottom surface 32 and a top surface 34 is formed on top of the glass layer 20. The term "piezo stack" refers to a multilayered stratum of the lens assembly 10 which provides certain piezoelectric functions. In one example embodiment this piezo stack comprises the following layers: platinum, lead zirconate titanate (PZT), and platinum. However, various other piezo stack configurations care also used such as aluminum oxide, aluminum nitride, Ta2O5, etc.

Figure 2:
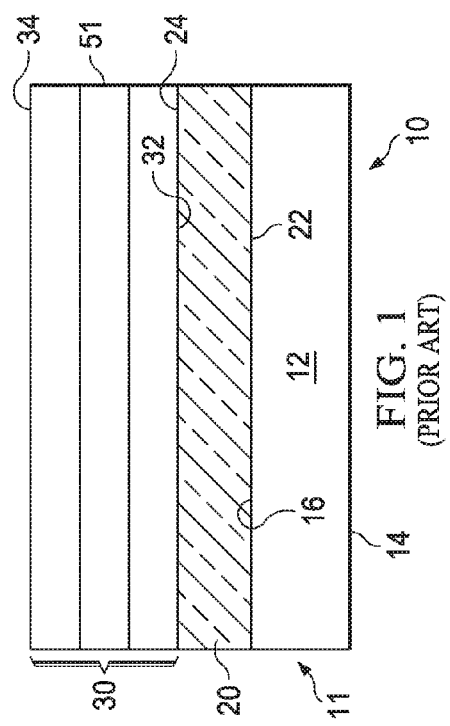

FIG. 2 illustrates the lens assembly of FIG. 1 after etching of a topside cavity 40 in the piezo stack 32. The cavity 40 exposes the top surface 24 of the glass layer 20.

Figure 3:
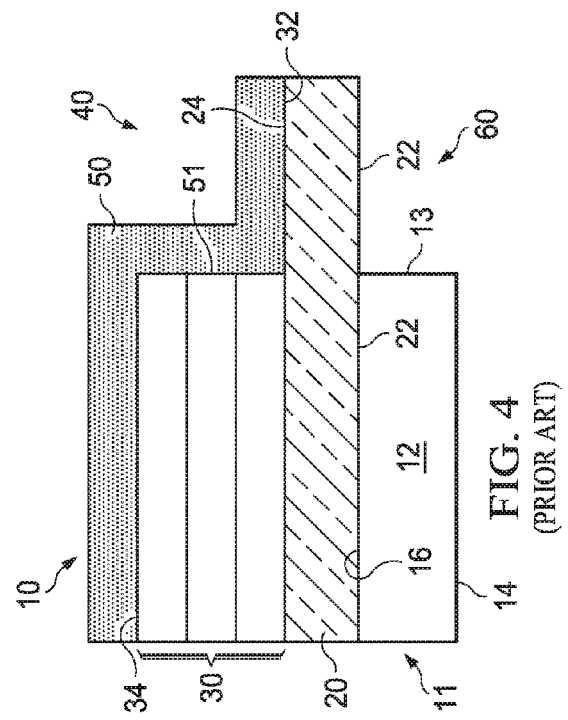

FIG. 3 illustrates the lens assembly of FIG. 2 after application of a moisture barrier layer 50 to the top surface 34 and an etched lateral side surface 51 of the piezo stack 32, and to the top surface 24 of the glass layer 20.

Figure 4:
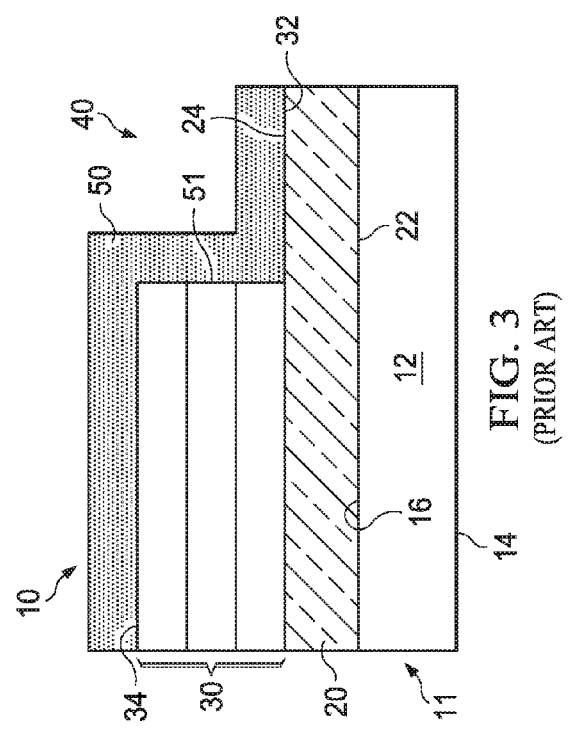

FIG. 4 shows the lens assembly of FIG. 3 after formation of a bottom cavity 60 in the substrate layer 12.

In FIG. 5, a lower moisture barrier layer 70 has been applied to the lens assembly 10 of FIG. 4. Moisture barrier 70 interfaces with the bottom surface 22 of the glass layer 20. Moisture barrier 70 also interfaces with the bottom surface 14 of the substrate 12 and an exposed lateral side surface 13 thereof.

FIG. 6 is a schematic illustration of an example embodiment of a new lens assembly 110 for a piezoelectric optical MEMS ("POMEMS") device that has embedded moisture layers 140, 150. A plurality of such lens assemblies 110 may be formed on a semiconductor wafer 111. The lens assembly 110 includes a semiconductor substrate 112 (a portion of wafer 111) having a bottom surface 114 and a top surface 116. The lower moisture barrier layer 140 is formed on the top surface 116 of the semiconductor layer 112.

As further illustrated by FIG. 6, a glass layer 120 having a bottom surface 122 and the top surface 124 is formed on top of the lower moisture barrier layer 140. The upper moisture barrier layer 150, has a bottom surface 152 and a top surface 154. The upper moisture barrier layer 150 is formed on top of the glass layer 120. A piezo stack 130 having a bottom surface 132 and a top surface 134 is formed on top of the moisture barrier layer 150.

Figure 7:
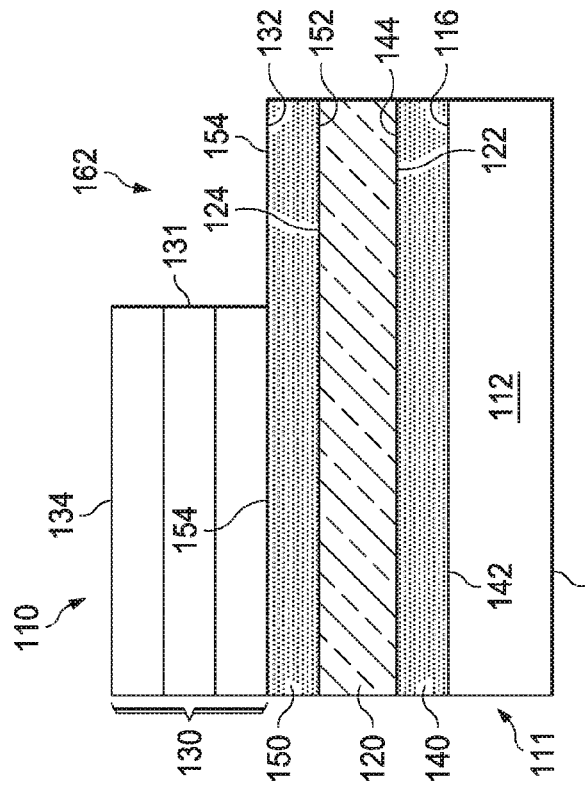

FIG. 7 illustrates the lens assembly 110 of FIG. 6 after formation of a cavity 162 in the piezo stack 130. The cavity 162 exposes a lateral side surface 131 of the piezo stack 130 and also exposes a top surface 154 of the upper moisture barrier layer 150. The cavity formation may be performed by a conventional process, such as Deep Reactive-Ion Etching (DRIE), or other deep silicon dry etch or wet etch processes.

Figure 8:
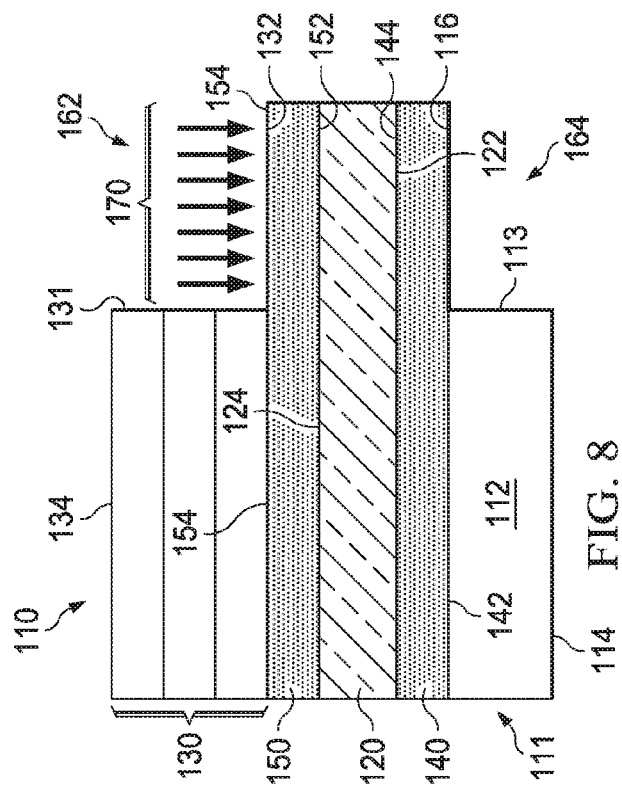
FIGS. 7 through 9 are illustrations of the lens assembly of FIG. 6 after performance of successive process steps thereon.

FIG. 8 shows the lens assembly 110 of FIG. 7 after backside cavity formation creates a cavity 164 in the semiconductor substrate 112. This cavity 164 exposes the bottom surface 142 of the lower moisture barrier layer 140. It also exposes a lateral side surface 113 of the semiconductor layer 112. It may be seen from FIG. 8 that a portion of the glass layer 120 and the lower and upper moisture barrier layers 140, 150 bonded thereto form a cantilever beam 170 extending laterally outwardly from the remainder of the lens assembly 110. In this embodiment, no moisture barrier is provided on the lateral side surface 113 of the substrate layer 112 or on the lateral side surface 131 of the piezo of stack 130.

Figure 9:
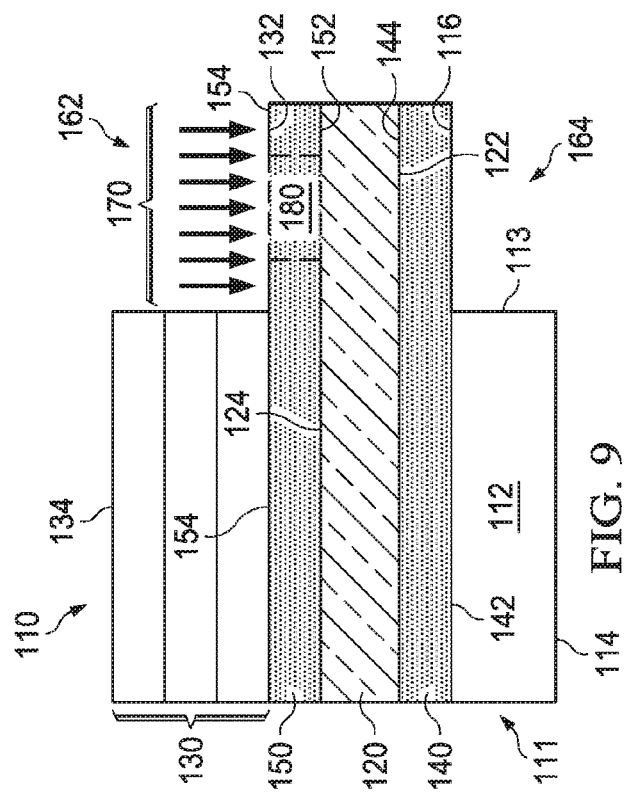

The embedded moisture barrier layers 140, 150 shown in FIGS. 6-8 may be a single thin film layer or a stack of multiple thin-film layers, such as a mix of oxide and SiON or SiN, depending upon the lens assemblies requirements. These embedded layers 140, 150 may also be designed as a combination of moisture barrier, etch stop layer, and anti-reflective coating. When such a combination stack includes an etch stop layer, the embedded moisture barrier layer 140 or 150 can protect the full thickness of the glass layer 120 by allowing plasma etch 180 to etch stop at the moisture barrier layer 150 instead of the glass layer 120, as shown in FIG. 9. The etch-stop layer is thus part of the moisture barrier stack layers when it is applied. Because the etch-stop layer may not have the desired optical properties like the remaining part of the moisture barrier, it is designed to be as thin as possible to minimize its impact on the optical transmission.

Using the new process illustrated in FIGS. 6-9, the glass layer 120 is sealed as soon as the moisture barrier layers 140, 150 are formed. Thus, exposing a wafer with open apertures to a fab environment or to the environment in subsequent manufacturing processes is no longer a concern. Furthermore, this new process eliminates the need to coat moisture barriers onto the glass layer at the end of the fabrication process, which simplifies the entire process. It also eliminates coating after backside cavity formation and the associated special wafer handling. Thus, advantages of the new process may include simplicity, better manufacturability and reduced cost.

Figure 10:
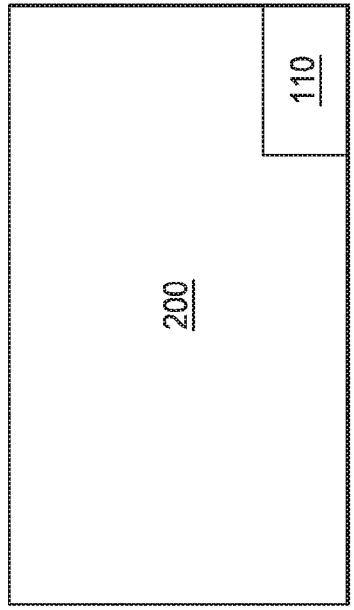
FIG. 10 is a schematic POMEMS device, including a lens assembly of the type illustrated in FIG. 9.

A piezoelectric optical micro-electro-mechanical systems (POMEMS) device 200 is illustrated schematically in FIG. 10. One component of the device 200 is a lens assembly 110 as illustrated and described above with reference to FIG. 8.

Figure 11:
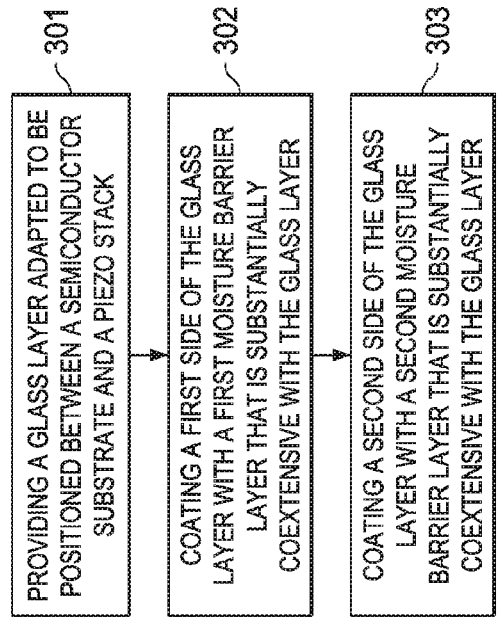
FIG. 11 is a flowchart illustrating a method of forming a plurality of POMEMS components on a semiconductor wafer.

A method of making a piezoelectric optical micro-electromechanical systems (POMEMS) device is illustrated in FIG. 11. The method includes, as shown at block 301, providing a glass layer adapted to be positioned between a semiconductor substrate and a piezo stack. The method further includes, as shown at bock 302, coating a first side of the glass layer with a first moisture barrier layer that is substantially coextensive with the glass layer. The method also includes, as shown at block 303, coating a second side of the glass layer with a second moisture barrier layer that is substantially coextensive with the glass layer.

Although certain specific embodiments of a piezoelectric optical micro-electro-mechanical systems (POMEMS) device and methods of making the same are expressly described in detail herein, other embodiments thereof will occur to those skilled in the art after reading this disclosure. It is intended that the language of the appended claims be broadly construed to cover such alternative embodiments, except as limited by the prior art.

What is claimed is:

1. A piezoelectric optical micro-electro-mechanical systems (POMEMS) device comprising:
    a glass layer having a first surface and an opposite second surface;
    a first moisture barrier layer having a first surface and an opposite second surface, said second surface of said first moisture barrier layer being substantially coextensive with and interfacing with said first surface of said glass layer; at least a piezo stack being attached on said first side of said first moisture barrier layer; and
    a second moisture barrier layer having a first surface and an opposite second surface, said first surface thereof being substantially coextensive with and interfacing with said second surface of said glass layer; at least a semiconductor substrate being attached on said second side of said second moisture barrier layer.

2. The POMEMS device of claim 1 wherein at least one of said first and second moisture barrier layers comprises at least a single film layer.

3. The POMEMS device of claim 2 wherein at least one of said first and second moisture barrier layers comprises a plurality of film layers.

4. The POMEMS device of claim 2 wherein at least one of said first and second moisture barrier layers comprises at least one film layer of oxide.

5. The POMEMS device of claim 2 wherein at least one of said first and second moisture barrier layers comprises a film layer of SiON.

6. The POMEMS device of claim 2 wherein at least one of said first and second moisture barrier layers comprises a film layer of SiN.

7. The POMEMS device of claim 2 wherein at least one of said first and second moisture barrier layers comprises an etch stop layer.

8. The POMEMS device of claim 7 wherein said etch stop layer is plasma etched and said glass layer is not plasma etched.

9. The POMEMS device of claim 2 wherein said piezo stack is not coextensive with said first moisture barrier and a portion of said first moisture barrier is exposed.

10. The POMEMS device of claim 2 wherein said semiconductor substrate is not coextensive with said second moisture barrier and a portion of said second moisture barrier is exposed.

* * * * *